US006628685B1

(12) United States Patent
Shieh

(10) Patent No.: US 6,628,685 B1
(45) Date of Patent: Sep. 30, 2003

(54) METHOD OF FABRICATING LONG-WAVELENGTH VCSEL AND APPARATUS

(76) Inventor: Chan-Long Shieh, 6739 E. Bar Z La., Paradise Valley, AZ (US) 85253

( * ) Notice: Subject to any disclaimer, the term of this patent is extended or adjusted under 35 U.S.C. 154(b) by 299 days.

(21) Appl. No.: 09/642,359

(22) Filed: Aug. 21, 2000

(51) Int. Cl.$^7$ ............................................... H01S 5/187
(52) U.S. Cl. ............................. 372/45; 372/96; 372/99
(58) Field of Search .......................... 372/43, 45, 46, 372/50, 96, 99

(56) References Cited

U.S. PATENT DOCUMENTS 5,914,973 A * 6/1999 Jiang et al. ................... 372/96
6,347,106 B1 * 2/2002 Dijaili et al. ................. 372/46

* cited by examiner

Primary Examiner—Minh Loan Tran
(74) Attorney, Agent, or Firm—Parsons & Goltry; Robert A. Parsons; Michael W. Goltry

(57) ABSTRACT

A long-wavelength VCSEL, and method of fabrication, includes a long-wavelength active region epitaxially grown on a compatible substrate with a high heat conductivity DBR mirror stack metamorphically grown on the active region. A supporting substrate is bonded to the DBR mirror stack and the compatible substrate is removed. A second mirror stack, either a DBR or a dielectric mirror stack, is formed on the opposite surface of the active region. Preferably, an InP based active region is grown on an InP based substrate and an AlAs/GaAs based metamorphic DBR mirror stack is metamorphically grown on the active region. The supporting substrate may be either an InP based substrate bonded to the active region or a layer of plated metal, such as copper, silver, gold, nickel, aluminum, etc.

14 Claims, 3 Drawing Sheets

METHOD OF FABRICATING LONG-WAVELENGTH VCSEL AND APPARATUS

FIELD OF THE INVENTION

This invention relates to a method of fabricating a vertical cavity surface emitting laser which is capable of emitting long-wavelength light and to the vertical cavity surface emitting laser.

BACKGROUND OF THE INVENTION

Vertical cavity surface emitting lasers (VCSELs) include first and second distributed Bragg reflectors (DBRs) formed on opposite sides of an active area. The VCSEL can be driven or pumped electrically by forcing current through the active area or optically by supplying light of a desired frequency to the active area. Typically, DBRs or mirror stacks are formed of a material system generally consisting of two materials having different indices of refraction and being easily lattice matched to the other portions of the VCSEL. In conventional VCSELs, conventional material systems perform adequately.

However, new products are being developed requiring VCSELs which emit light having long-wavelengths. VCSELs emitting light having long-wavelengths are of great interest in the optical telecommunications industry. This long-wavelength light can be generated by using a VCSEL having an InP based active region. When an InP based active region is used, however, the DBRs or mirror stacks lattice matched to the supporting substrate and the active region do not provide enough reflectivity for the VCSELs to operate because of the insignificant difference in the refractive indices between the two DBR constituents.

Dielectric mirror stacks can be used for VCSEL applications, but they suffer from poor thermal conductivity. Since the performance of these long-wavelength materials is very sensitive to temperature, the thermal conductivity of the DBRs is very important.

Accordingly it is highly desirable to provide a method of fabricating long-wavelength VCSELs with good thermal conductivity.

It is an object of the present invention to provide new and improved methods of fabricating long-wavelength vertical cavity surface emitting lasers.

It is another object of the present invention to provide new and improved methods of fabricating long-wavelength vertical cavity surface emitting lasers in which materials with good thermal conductivity and refractive indices are used.

It is still another object of the present invention to provide new and improved long-wavelength vertical cavity surface emitting lasers.

It is a further object of the present invention to provide new and improved long-wavelength vertical cavity surface emitting lasers incorporating materials with good thermal conductivity and refractive indices.

It is yet a further object of the present invention to provide new and improved long-wavelength vertical cavity surface emitting lasers which can be either optically or electrically pumped.

SUMMARY OF THE INVENTION

A long-wavelength VCSEL is disclosed with a novel method of fabrication. The VCSEL includes a long-wavelength active region epitaxially grown on a compatible substrate with a high heat conductivity distributed Bragg reflector (DBR) mirror stack metamorphically grown on the active region. A supporting substrate is bonded to the DBR mirror stack and the compatible substrate is removed. A second mirror stack, either a DBR or a dielectric mirror stack, is formed on the opposite surface of the active region. The supporting substrate can be, for example, a thick metal layer deposited on the DBR or a second semiconductor type of substrate. The DBR and second mirror stack are preferably formed of materials with good thermal conductivity and refractive indices.

In a preferred embodiment, an indium phosphide (InP) active region is grown on an InP based substrate and an AlAs/GaAs based metamorphic DBR mirror stack is epitaxially grown on the active region. AlAs/GaAs has good thermal conductivity and sufficiently different refractive indices to produce a good mirror stack. The supporting substrate may be either a mechanical InP based substrate bonded to the active region or a layer of plated metal, such as copper, silver, gold, nickel, aluminum, etc. The plated metal supporting substrate provides additional thermal conductivity for the VCSEL.

BRIEF DESCRIPTION OF THE DRAWINGS

Referring to the drawings.

DESCRIPTION OF THE PREFERRED EMBODIMENTS

Figure 1:
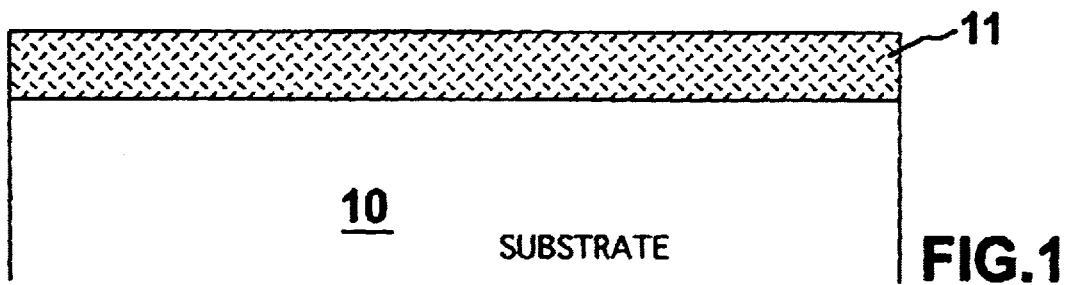
FIGS. 1 through 5 are simplified sectional views illustrating sequential steps in a method of fabricating VCSELs in accordance with the present invention.

Turning now to FIGS. 1 through 5, various steps are illustrated, sequentially, in a method of fabricating vertical cavity surface emitting lasers (VCSELs) in accordance with the present invention. Referring specifically to FIG. 1, a substrate 10 is provided which may be, for example a semiconductor wafer or the like. A long-wavelength active region 11 is formed on the upper surface of substrate 10 in any well known process. Generally, active region 11 includes one or more quantum well layers with barrier layers therebetween and cladding and/or spacer layers defining the upper and lower surfaces. As is understood by those skilled in the art, active region 11 is formed with a thickness of approximately one wavelength to multiple wavelengths of the emitted light.

In a preferred embodiment, active region 11 is based on an indium phosphide (InP) material system to provide a long-wavelength active region. Further, substrate 10 preferably includes InP so that active region 11 can be conveniently epitaxially grown on the surface with the desired crystal lattice matching. For reasons that will be explained in more detail presently, a thin etch-stop layer (not shown) can also be included as a lower portion of active region 11. Generally, the etch-stop layer can be any convenient and compatible material with a large differential etching capability relative to substrate 10.

Figure 2:
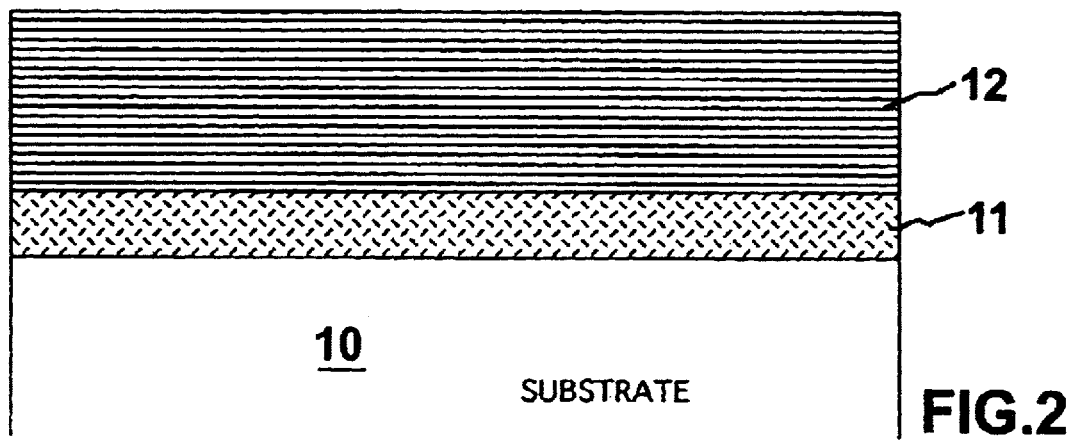

Referring additionally to FIG. 2, a distributed Bragg reflector (DBR) mirror stack 12 is formed on the upper surface of active region 11. As explained briefly above, it is common in the prior art to epitaxially grow alternate layers of, for example, InGaAsP and InAlGaAs on an InP based active region. The major problem with this type of DBR is that the refractive index difference is too small to provide good reflectivity. Dielectric mirror stacks can be used, but they suffer from poor thermal conductivity. It has been found that materials with good thermal conductivity and refractive indices can be metamorphically grown on long-wavelength active region 11. In this context, the term "good thermal conductivity" generally means a thermal conductivity at least as good as the thermal conductivity of an AlAs/GaAs DBR.

In a specific example, substrate 10 is an InP based semiconductor wafer and long-wavelength active region 11 is grown on substrate 10. Long-wavelength active region 11 includes, for example, one or more quantum well layers of InGaAsP with InP barrier layers therebetween. Cladding or spacer layers on opposed sides of the quantum well layers include, for example, InP. In this specific example, alternate layers of AlAs and GaAs are grown metamorphically on active region 11 to form DBR 12. As is understood by those skilled in the art, DBR 12 includes a sufficient number of mirror pairs (e.g., 20 to 40) so as to provide a high reflectivity for light generated by active region 11.

Here it should be understood that "metamorphic growth" is a type of epitaxial growth (e.g. by PCVD, MOCVD, PECVD, CVD, sputtering, etc.,) in which the crystal lattice of the grown material does not strictly match the lattice of the substrate. By metamorphically growing the grown material, the lattice of the grown material gradually changes from similar to the lattice of the substrate to the relaxed lattice of the grown material. In this fashion, DBR materials with good thermal conductivity and large difference in index of refraction can be conveniently grown on a long-wavelength active region. Some examples of pairs of material with good thermal conductivity and index of refraction which can be metamorphically grown on a long-wavelength active region are: AlAs and GaAs; micro-crystalline silicon and microcrystalline silicon carbide; and micro-crystalline silicon and micro-crystalline aluminum oxide. Here it should be noted that AlAs/GaAs is a specific example of a metamorphically distributed Bragg reflector including layers of $Al_xGa_{1-x}As/Al_yGa_{1-y}As$, where x is in a range of from approximately 0.5 to 1 and y is in a range of from approximately 0 to 0.5.

Figure 3:
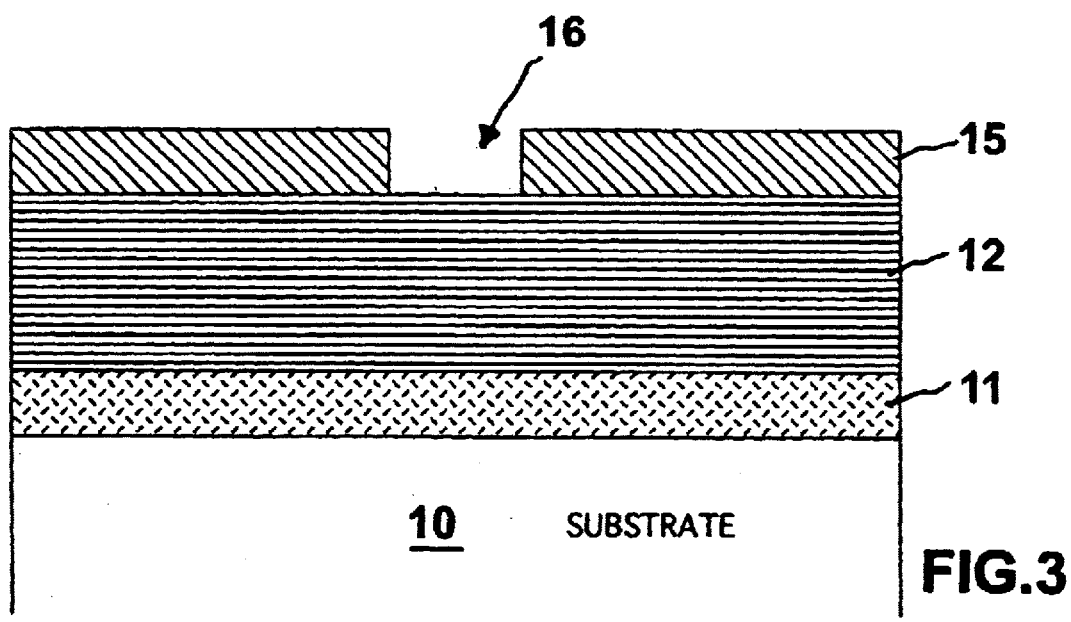

Referring to FIG. 3, once DBR mirror stack 12 is completed a heat spreader is formed on the upper surface. Generally, the heat spreader is some metal with high heat conductivity, such as copper, silver, gold, nickel, aluminum, etc. In a preferred embodiment, the heat spreader includes a first thin layer 15 which may be, for example, vacuum deposited or the like. Also, in this specific embodiment the VCSEL is designed for optical pumping and therefore an opening 16 is formed in layer 15 as an inlet for light to be used in the optical pumping, or exciting of active region 11. Opening 16 can be formed in layer 15 by well known masking techniques, selective deposition, etc.

Figure 4:
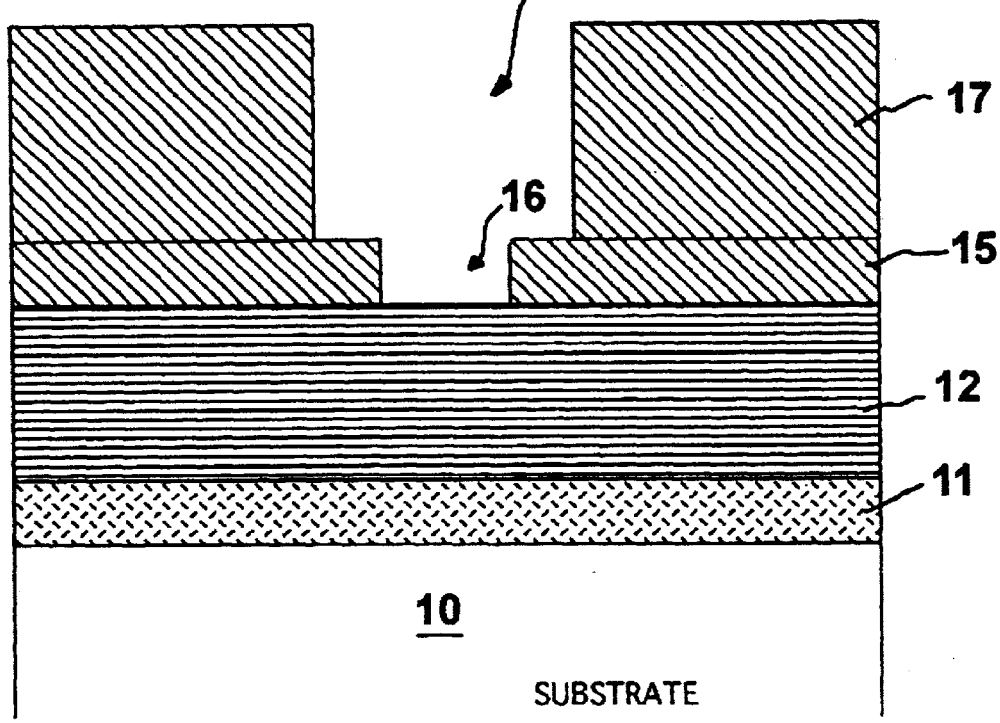

With layer 15 formed on the surface of DBR mirror stack 12, additional metal 17 is plated onto layer 15, as illustrated in FIG. 4, using a well known metal plating process (e.g., electroplating, vacuum deposition, or the like). Layer 15 is provided as a plating contact for electroplating and/or to allow for selective plating of additional metal 17. Because In this preferred embodiment and for purposes of example only, layer 17 is selectively plated onto layer 15, a larger opening 18 is automatically formed by the plating process in layer 17. The selective plating may have to be done in multiple steps to achieve the required total thickness (e.g. >100 μm) for both mechanical support and a small optical aperture (e.g. <10 μm).

Figure 5:
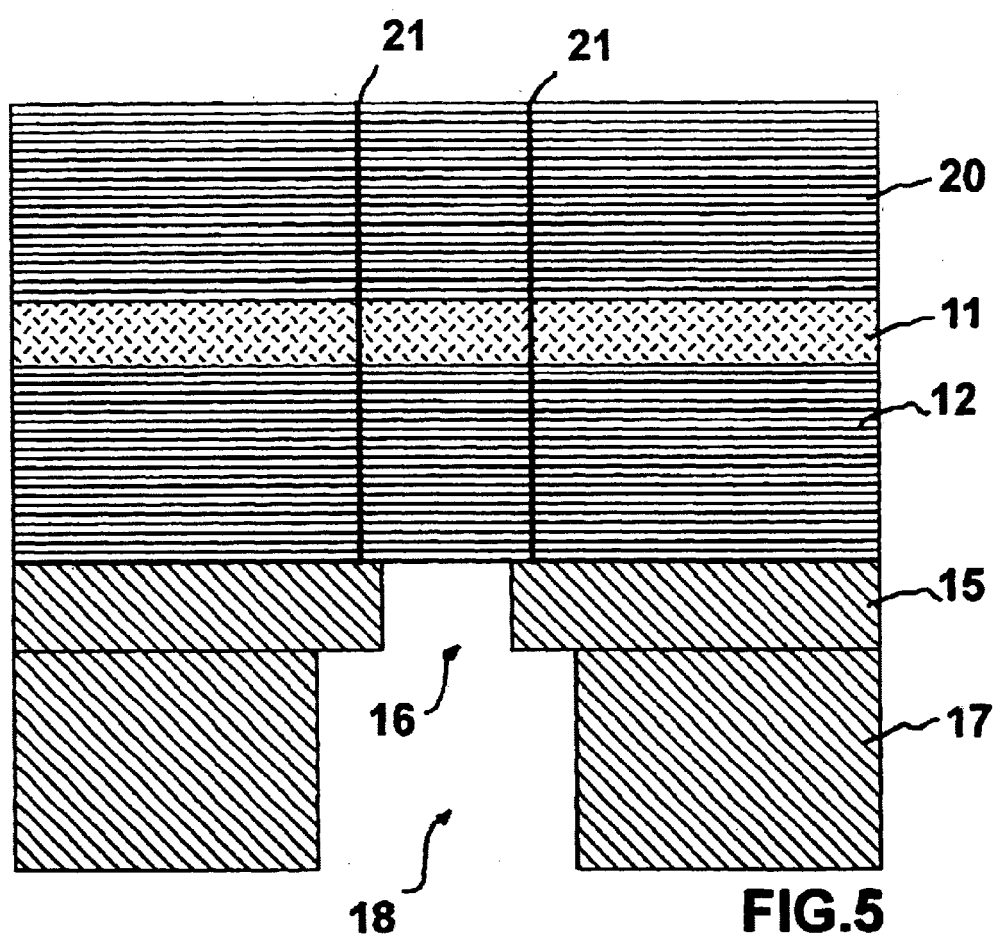

Referring additionally to FIG. 5, once layers 15 and 17 are completed to provide a supporting substrate, substrate 10 is removed. As will be understood by those skilled in the art, substrate 10 can be removed by standard etching techniques, grinding and etching, etc. To facilitate the etching process, an etch-stop layer can be provided between substrate 10 and active region 11, if desired. Such etch-stop layers are well known in the art and will not be discussed further.

Upon the removal of substrate 10, exposing the other side of active region 11, a second mirror stack 20 is formed on the exposed surface of active region 11. Because most of the heat produced by the VCSEL is conducted away by the good thermal conductivity of DBR mirror stack 12 and the heat spreader (i.e. layers 15 and 17), either a dielectric mirror stack can be deposited on the exposed surface of active region 11 or the composite structure can be used to grow another metamorphic DBR mirror stack on the exposed surface of active region 11.

Generally, if the VCSEL is to be an optically pumped laser, mirror stack 20 is most conveniently formed as a dielectric mirror stack. When the VCSEL is to be an electrically pumped laser, electrical contact is generally made to both sides of active region 11. Electrical contact through DBR mirror stack 12 can be provided by simply doping DBR mirror stack 12 during growth. Electrical contact to the other side of active region 11 generally requires some form of electrical conductor between the dielectric mirror stack and active region 11 (since a dielectric mirror stack is not electrically conductive) or doped metamorphic DBR mirror stacks on both sides of active region 11.

Generally, to define a lapsing cavity for efficient operation of the VCSEL, some form of index guiding structure is used. In this specific embodiment, for example, index guiding structures can be formed by patterning active region 11 after substrate 10 is removed and/or by patterning mirror stack 20. As illustrated in FIG. 5 by cylindrical line or wall 21 a lasing volume or cavity is defined within active area 11. Cylindrical line or wall 21 can be formed using a number of well known methods, including etching one or all of the portions (i.e. layers 11, 12, and 20) outside of line 21, damaging the portion or portions so that they will not conduct light, or otherwise limiting the operation of the VCSEL to the volume within line 21. The index guiding structure used is also generally used to separate a plurality of VCSELs fabricated on a common substrate or wafer into individual wafers or arrays.

Figure 6:
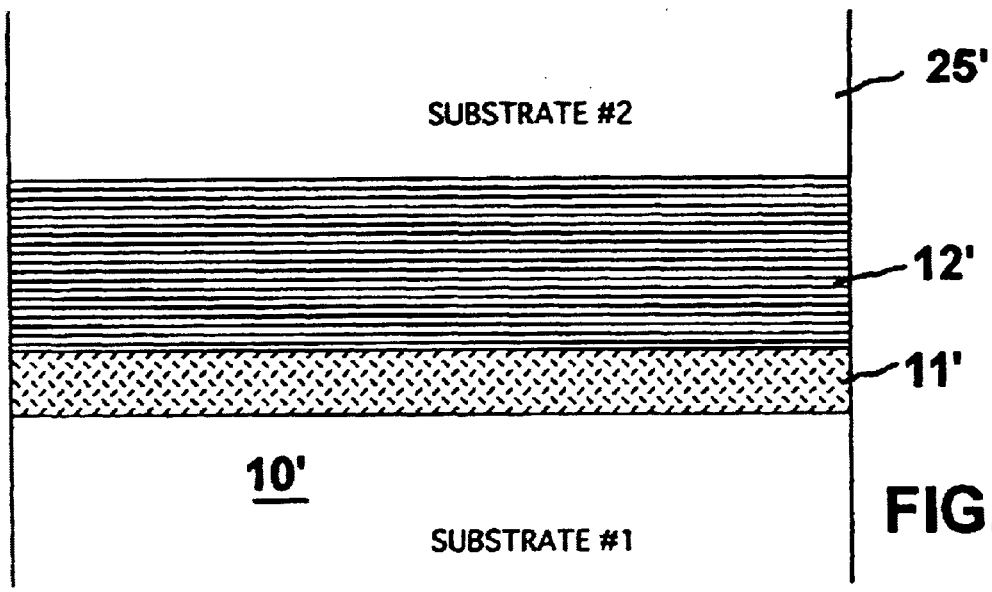
FIGS. 6 through 8 are simplified sectional views illustrating sequential steps in another method of fabricating VCSELs in accordance with the present invention.
Figure 7:
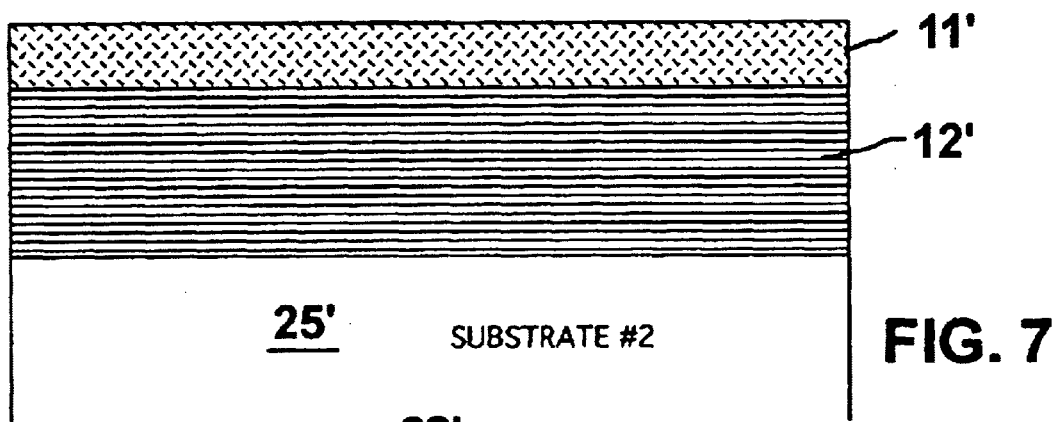
Figure 8:
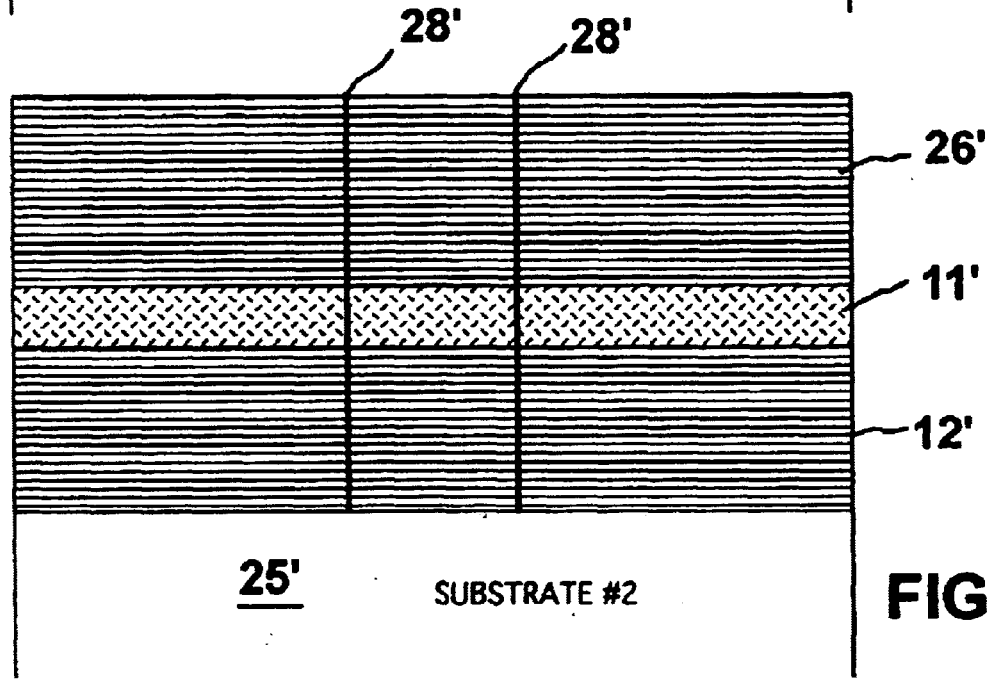

Turning now to FIGS. 6 through 8, several sequential steps are illustrated in another fabrication process of a long-wavelength VCSEL in accordance with the present invention. In this method, the substrate, active region, and DBR mirror stack of FIG. 2 is used as the basis. In FIG. 6, components similar to those illustrated in FIG. 2 are designated with a similar number and all numbers have a prime added to indicate the different embodiment. In this embodiment a substrate 25' is bonded to the upper exposed surface of DBR mirror stack 12', rather than depositing a heat spreader as in FIGS. 3 and 4. Further, substrate 10' is designated substrate #1 and substrate 25' is designated substrate #2 only for purposes of differentiating the two substrates.

In this preferred embodiment, DBR mirror stack 12' is metamorphically grown on active region 11' so that if, for example, substrate 10' is InP based and active region 11' is InP based, then substrate 25' could be InP based and would alleviate any thermal mismatch problems because substrate 25' is essentially bonded to an InP based structure. That is, after the metamorphic growth, substrate 25' is thermally bonded to a mechanical InP based substrate. This process can be done with large size wafers because there is no thermal mismatch between substrate 10' and substrate 25'. Once substrate 25' is bonded to the structure, substrate 10' is removed (see FIG. 7) to expose the other surface of active region 11'.

Upon the removal of substrate 10', exposing the other side of active region 11', a second mirror stack 26' is formed on the exposed surface of active region 11'. Because most of the heat produced by the VCSEL is conducted away by the good thermal conductivity of DBR mirror stack 12', either a dielectric mirror stack can be deposited on the exposed surface of active region 11' or the composite structure can be used to grow another metamorphic DBR mirror stack on the exposed surface of active region 11'.

Generally, as described above, to define a lasing cavity for efficient operation of the VCSEL, some form of index guiding structure is used. In this specific embodiment, for example, index guiding structures can be formed by patterning active region 11' after substrate 10' is removed and before mirror stack 26' is deposited. Index guiding structures can also be formed by patterning mirror stack 25' during deposition or growth. As illustrated in FIG. 8 by cylindrical line or wall 28' a lasing volume or cavity is defined within active area 11'. Cylindrical line or wall 28' can be formed using a number of well known methods, including etching one or all of the portions (i.e. layers 11', 12', and 26') outside of line 28', damaging the portion or portions so that they will not conduct light, or otherwise limiting the operation of the VCSEL to the volume within line 28'.

Thus, new and improved methods of fabricating long-wavelength vertical cavity surface emitting lasers have been disclosed in which materials with good thermal conductivity and refractive indices are used. Also, substrates bonded to the VCSEL structure during fabrication are thermally matched to the structure so that thermal mismatch problems are avoided and large size wafers can be used. Further, new and improved long-wavelength vertical cavity surface emitting lasers are disclosed incorporating materials with good thermal conductivity and refractive indices. The good thermal conductivity material is used in a structure that provides good heat sinking capabilities. The new and improved long-wavelength vertical cavity surface emitting lasers can be either optically or electrically pumped and either can be fabricated using well known semiconductor processes.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A long-wavelength vertical cavity surface emitting laser comprising:
    a long wave-length active region having a first major surface;
    a metamorphic distributed Bragg reflector grown on the first major surface of the long wave-length active region so as to define a major surface of the metamorphic distributed Bragg reflector;
    a supporting substrate mechanically bonded to the major surface of the metamorphic distributed Bragg reflector; and
    a mirror stack positioned on an opposed second major surface of the long wave-length active region.

2. A long-wavelength vertical cavity surface emitting laser as claimed in claim 1 wherein the long wave-length active region includes an indium phosphide based active region.

3. A long-wavelength vertical cavity surface emitting laser as claimed in claim 1 wherein the metamorphic distributed Bragg reflector includes layers of material with good thermal conductivity.

4. A long-wavelength vertical cavity surface emitting laser as claimed in claim 3 wherein the layers of material with good thermal conductivity include layers of material with a thermal conductivity comparable to a lattice matched semiconductor distributed Bragg reflector.

5. A long-wavelength vertical cavity surface emitting laser as claimed in claim 1 wherein the metamorphic distributed Bragg reflector includes layers of $Al_xGa_{1-x}As/Al_yGa_{1-y}As$, where x in a range of from approximately 0.5 to 1 and y is in a range of from approximately 0 to 0.5, grown on-the indium phosphide based long wave-length active region.

6. A long-wavelength vertical cavity surface emitting laser as claimed in claim 5 wherein the metamorphic distributed Bragg reflector includes layers of AlAs/GaAs metamorphically grown on the indium phosphide based long wave-length active region.

7. A long-wavelength vertical cavity surface emitting laser as claimed in claim 1 wherein the supporting substrate includes a supporting substrate approximately thermally matched to the metamorphic distributed Bragg reflector.

8. A long-wavelength vertical cavity surface emitting laser as claimed in claim 1 wherein the supporting substrate is approximately thermal-expansion matched to the metamorphic distributed Bragg reflector.

9. A long-wavelength vertical cavity surface emitting laser as claimed in claim 1 wherein the supporting substrate includes a mechanical InP substrate bonded to the metamorphic distributed Bragg reflector.

10. A long-wavelength vertical cavity surface emitting laser as claimed in claim 1 wherein the supporting substrate includes a supporting layer of heat conducting material plated on the major surface of the metamorphic distributed Bragg reflector.

11. A long-wavelength vertical cavity surface emitting laser as claimed in claim 1 wherein the supporting layer of heat conducting material includes one of copper, silver, gold, nickel, and aluminum.

12. A long-wavelength vertical cavity surface emitting laser as claimed in claim 1 wherein the mirror stack includes one of a distributed Bragg reflector and a dielectric mirror stack.

13. A long-wavelength vertical cavity surface emitting laser as claimed in claim 1 including in addition a light inlet opening through the supporting substrate for optically pumping the long-wavelength vertical cavity surface emitting laser.

14. A long-wavelength vertical cavity surface emitting laser as claimed in claim 1 including in addition at least one of the long wave-length active region and the mirror stack being formed to provide index guiding for the long-wavelength vertical cavity surface emitting laser.

* * * * *